US012142342B2

(12) United States Patent
Lin et al.

(10) Patent No.: US 12,142,342 B2
(45) Date of Patent: Nov. 12, 2024

(54) MEMORY CIRCUIT WITH SENSE AMPLIFIER CALIBRATION MECHANISM

(71) Applicant: Industrial Technology Research Institute, Hsinchu (TW)

(72) Inventors: Chih-Sheng Lin, Tainan (TW); Fu-Cheng Tsai, Tainan (TW); Tuo-Hung Hou, Hsinchu (TW); Jian-Wei Su, Hsinchu (TW); Yu-Hui Lin, Hsinchu County (TW); Chih-Ming Lai, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 156 days.

(21) Appl. No.: 18/074,528

(22) Filed: Dec. 5, 2022

(65) Prior Publication Data

US 2023/0267973 A1     Aug. 24, 2023

Related U.S. Application Data

(60) Provisional application No. 63/312,099, filed on Feb. 21, 2022.

(51) Int. Cl.
    *G11C 7/06*     (2006.01)
    *G11C 7/10*     (2006.01)
    *G11C 7/12*     (2006.01)

(52) U.S. Cl.
    CPC ............ *G11C 7/067* (2013.01); *G11C 7/1063* (2013.01); *G11C 7/12* (2013.01)

(58) Field of Classification Search
    CPC .................................. G11C 7/067; G11C 7/06

(Continued)

(56) References Cited

U.S. PATENT DOCUMENTS 6,195,289 B1 * 2/2001 Pasotti ................ G11C 27/005
                                                   365/185.21
7,333,778 B2    2/2008   Pehlke et al.
                          (Continued)

FOREIGN PATENT DOCUMENTS

CN         109256158        1/2019
CN         111863050        10/2020

(Continued)

OTHER PUBLICATIONS

Iason Giannopoulos et al.,"Temperature Compensation Schemes for In-Memory Computing using Phase-change Memory",2020 IEEE International Conference on Artificial Intelligence Circuits and Systems(AICAS),Aug. 2020,pp. 286-290.*

(Continued)

*Primary Examiner* — Muna A Techane
(74) *Attorney, Agent, or Firm* — JCIPRNET

(57) ABSTRACT

According to an exemplary embodiments, the disclosure is directed to a memory circuit which includes not limited to a first half sense amplifier circuit connected to a first plurality of memory cells through a first bit line and configured to receive a unit of analog electrical signal from each of the first plurality of memory cells and to generate a first half sense amplifier output signal corresponding to the first bit line based on a first gain of the half sense amplifier and an accumulation of the units of analog signals, a locking code register circuit configured to receive a locking data and to generate a digital locking sequence, and a source selector circuit configured to receive the digital locking sequence and to generate a first adjustment signal to adjust the first half sense amplifier output signal corresponding to the first bit line by adjusting the first gain.

20 Claims, 15 Drawing Sheets

(58) Field of Classification Search
USPC .................................................. 365/185.21
See application file for complete search history.

(56) References Cited

U.S. PATENT DOCUMENTS

| | | | |
|---|---|---|---|
| 8,213,215 | B2 | 7/2012 | Chen et al. |
| 2002/0048187 | A1* | 4/2002 | Pierin .................... G11C 16/26 365/185.03 |
| 2004/0095826 | A1* | 5/2004 | Perner ...................... G11C 7/06 365/209 |
| 2016/0266175 | A1 | 9/2016 | Nizza et al. |
| 2020/0233923 | A1 | 7/2020 | Knag et al. |
| 2021/0143832 | A1 | 5/2021 | Fick et al. |
| 2021/0257017 | A1 | 8/2021 | Tsai et al. |
| 2022/0045873 | A1* | 2/2022 | Shin ........................ G06F 21/72 |

FOREIGN PATENT DOCUMENTS

| | | |
|---|---|---|
| CN | 111863052 | 10/2020 |
| TW | I415133 | 11/2013 |
| TW | 202044045 | 12/2020 |
| TW | 202107470 | 2/2021 |

OTHER PUBLICATIONS

Qing Dong et al.,"A 351TOPS/W and 372.4GOPS Compute-in-Memory SRAM Macro in 7nm FinFET CMOS for Machine-Learning Applications",2020 IEEE International Solid-StateCircuitsConference,Feb. 2020,pp. 1-3.*

Vinay Joshi et al.,"Accurate deep neural network inference using computational phase-change memory",Nature communications vol. 11,May 18, 2020,pp. 1-13.*

Yi-Chun Shih et al.,"Logic Process Compatible 40-nm16-Mb,Embedded Perpendicular-MRAM With Hybrid-Resistance Reference,Sub-ua A Sensing Resolution,and 17.5-nS Read Access Time",IEEE Journal O Fsolid-State Circuits,vol. 54,No. 4,Apr. 2019,pp. 1029-1038.*

"Notice of allowance of Taiwan Counterpart Application", issued on May 1, 2024, p. 1-p. 3.

Iason Giannopoulos et al., "Temperature Compensation Schemes for In-Memory Computing using Phase-Change Memory", 2020 IEEE International Conference on Artificial Intelligence Circuits and Systems (AICAS), Aug. 2020, pp. 286-290.

Yi-Chun Shih et al., "Logic Process Compatible 40-nm 16-Mb, Embedded Perpendicular-MRAM With Hybrid-Resistance Reference, Sub-µA Sensing Resolution, and 17.5-nS Read Access Time", IEEE Journal of Solid-State Circuits, vol. 54, No. 4, Apr. 2019, pp. 1029-1038.

Jinseok Kim et al., "Area-Efficient and Variation-Tolerant In-Memory BNN Computing using 6T SRAM Array", 2019 Symposium on VLSI Circuits Digest of Technical Papers, Jun. 9, 2019, pp. 1-2.

"Office Action of Taiwan Counterpart Application", issued on Nov. 13, 2023, p. 1-p. 6.

* cited by examiner

MEMORY CIRCUIT WITH SENSE AMPLIFIER CALIBRATION MECHANISM

CROSS-REFERENCE TO RELATED APPLICATION

This application claims the priority benefit of U.S. provisional application Ser. No. 63/312,099, filed on Feb. 21, 2022. The entirety of the above-mentioned patent application is hereby incorporated by reference herein and made a part of this specification.

TECHNICAL FIELD

The disclosure is directed to a memory circuit with a sense amplifier mechanism.

BACKGROUND

An artificial intelligence (AI) accelerator may often use a set of sense amplifiers (SA) or multiple sets of SAs in combination with multiple sets (>64) of analog to digital converter (ADC) circuits simultaneously in a parallel manner in order to achieve a very high performance. The sensing characteristics of these analog circuits may vary due to factors such as process drifts. These variations could be perceived as a random number and be accounted for by using wafer lock codes. However, when computation-in-memory (CIM) operations are performed, the sensing characteristics may drift in a dynamic manner causing errors to accumulate so as to cause a trained AI network to fail. In order to avoid such circumstances, the drifting of the sensing characteristics of sense amplifiers would need to be minimized.

FIG. 1 illustrates a partial block diagram of a conventional memory circuit 100 which implements a complementary CIM technique. The complementary CIM technique could be used to achieve a high computation precision and a high energy efficiency. However, such technique may require a high number of transistors (e.g. 8 or more transistors×2 rows or columns). As shown in FIG. 1, the memory circuit 100 includes not limited to a SA circuit 105 and a first column of cells 101 on bit line A (BL_A) and a second column of cells on bit line B (BL_B) forming a complementary weight, so that a single ternary weight may requires 16 MOSs or more. In comparison to a non-complementary architecture which merely requires a single column of cells (e.g. 8) cell to store a single ternary weight, the chip area of the complementary CIM technique would result in a larger chip area and a higher leakage. However, being high-precision is the advantage which the non-complementary architecture lacks.

The memory circuit 100 of FIG. 1 would be able to perform CIM operation based on a known mechanism of analog accumulation. For example, as shown in FIG. 1, assuming that a first memory cell 103 stores a binary '0' and does not contribute to the $I_{MOS}$ current which would have flown through the bitline RBL while the second memory cell 104 stores a binary '1' and thus contributes to the $I_{MOS}$ current which flows through the bitline RBL. Each of the first column of cells 101 on BL_A and each of the second column of cells on BL_B would contribute to the bitline current (i.e. $I_{MOS}$ current) of its respective column, and thus the SA circuit 105 compares the accumulated bitline current values between BL_A and BL_B and subsequently converts the compared the analog accumulated current values into digital outputs. However, during the conversion process, conversion errors may occur due to issues such as cell variations, SA mismatches, and other issues.

To be more specific, as shown in FIG. 2, the first memory circuit 201 is the ideal reading operation while performing the CIM operation. In the first memory circuit 201, BL_A is assumed to have accumulated 5 units of $I_{MOS}$ current, and BL_B is assumed to have accumulated 4 units of $I_{MOS}$ current. At this time, because the BL_A gain=the BL_B gain=1, and thus BL_A>BL_B, the output is determined by the SA to be 1. However, under the same accumulation conditions, for the second memory circuit 202, there is a gain mismatch during the conversion of the SA, and this means that the gains of the BL_A and BL_B are different. Assuming that the gain of BL_A is 0.8, and the gain of BL_B end gain=1.2, then the gains of BL_A and BL_B are not equal to the originally intended gain ratio of 1.0. Consequently, since the accumulated current of BL_B is 4.8 which is greater than the accumulated current of BL_A which is 4.0, this leads to an incorrect operation result caused by the drifting problem as described previously.

FIG. 3 shows a distribution of binary activation transfer curve (BATC) results for a 28 nm chip in CIM operation. According to the conventional design of SA circuits, the actual distribution may reach more than ±50% which is expected to greatly reduce the network accuracy as the errors of calculations may cause the network to completely unable to calculate correctly. One solution to minimize the drifts is to test the characteristics of each SA on every chip, and subsequently feed the measured characteristics back to a network training terminal to re-train the AI network. However, since the models and the data of each chip could be different, and the costs of trainings would likely increase the cost of fabricating the chips drastically.

Moreover, according to the actual wafer measurement and analysis, this phenomenon becomes more serious with the advanced manufacturing process. FIG. 4 shows a memory circuit architecture which utilizes a large quantity of SA circuits operating in parallel. For the memory circuit of FIG. 4 which contains thousands of SA circuits operating in parallel on the same chip, the distribution could be about ±20% at 0.18 um, but reaches ±50% at 28 nm, which makes implementing the CIM technology much more difficult for future products. Therefore, there is a demand for a sense amplifier circuit under a highly parallel CIM AI computing circuit architecture that could be readily used despite suffering the effects of characteristics drifts without having to re-train the AI network while still being able to achieve high performances.

SUMMARY OF THE DISCLOSURE

Accordingly, in order to resolve the above-described challenge, the disclosure is directed to a memory circuit having a sense amplifier calibration mechanism.

In one of the exemplary embodiments, the disclosure is directed to a memory circuit which includes not limited to: a first half sense amplifier circuit connected to a first plurality of memory cells through a first bit line and configured to receive a unit of analog electrical signal from each of the first plurality of memory cells and to generate a first half sense amplifier output signal on the first bit line based on a first gain of the half sense amplifier and an accumulation of each of the unit of analog electrical signal from each of the first plurality of memory cells, a locking code register circuit electrically connected to the first half sense amplifier circuit and configured to receive a locking data and to generate a digital locking sequence according to the locking data, and a source selector circuit configured to receive the digital locking sequence and to generate, from the digital locking sequence, a first adjustment signal to adjust the first half sense amplifier output signal on the first bit line by adjusting the first gain of the half sense amplifier.

In one of the exemplary embodiments, the disclosure is directed to a memory circuit which includes not limited to: a first half sense amplifier circuit connected to a first plurality of memory cells through a first bit line and configured to receive a unit of analog electrical signal from each of the first plurality of memory cells and to generate a first half sense amplifier output signal corresponding to the first bit line based on a first gain of the half sense amplifier and an accumulation of each of the unit of analog electrical signal from each of the first plurality of memory cells, a locking code register circuit electrically connected to the first half sense amplifier circuit and configured to receive a locking data and to generate a digital locking sequence according to the locking data, and a locking transistor circuit configured to receive the digital locking sequence and to generate, from the digital locking sequence, a first current signal having a first gain as the level of the first current signal is proportional to a binary value of the digital locking sequence.

In order to make the aforementioned features and advantages of the disclosure comprehensible, exemplary embodiments accompanied with figures are described in detail below. It is to be understood that both the foregoing general description and the following detailed description are exemplary, and are intended to provide further explanation of the disclosure as claimed.

It should be understood, however, that this summary may not contain all of the aspect and embodiments of the disclosure and is therefore not meant to be limiting or restrictive in any manner. Also the disclosure would include improvements and modifications which are obvious to one skilled in the art.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DETAILED DESCRIPTION OF DISCLOSED EMBODIMENTS

Figure 1:
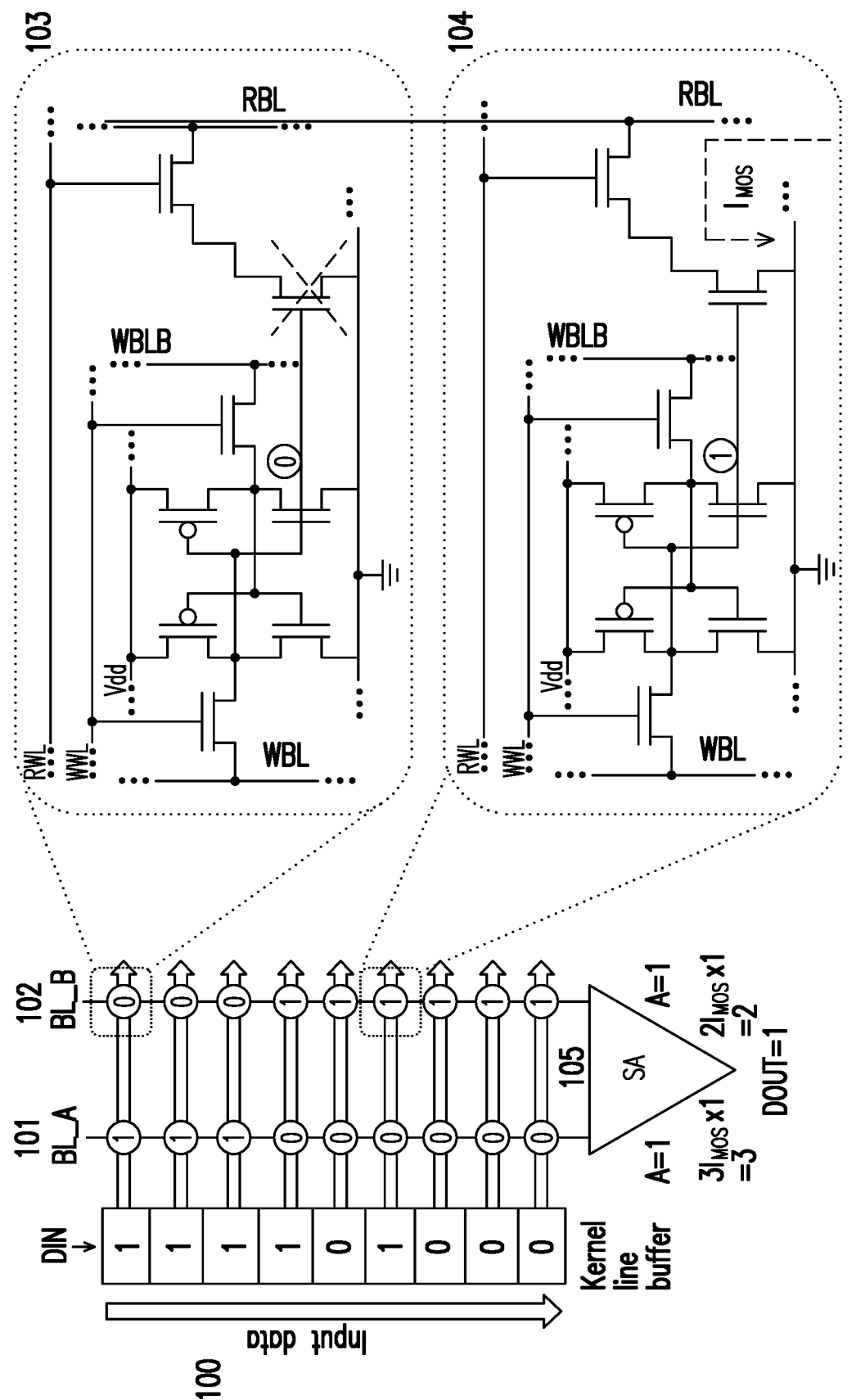
FIG. 1 illustrates a partial block diagram of a memory circuit which implements a complementary CIM technique.
Figure 2:
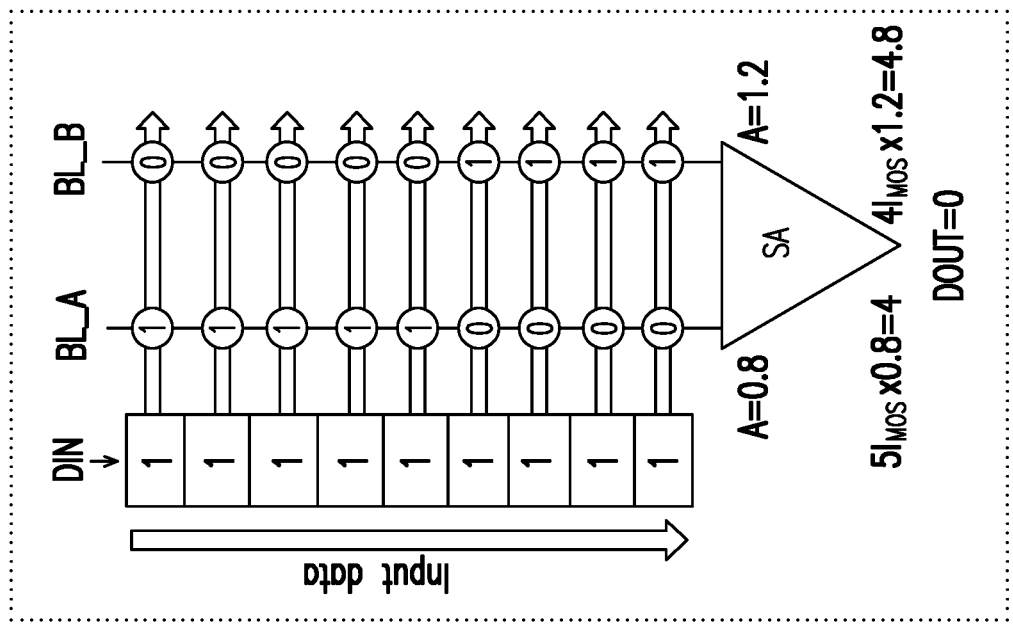
FIG. 2 illustrates a computation error related to the issue of process drift for the memory circuit of FIG. 1 during a computation of a ternary weight.
Figure 2:
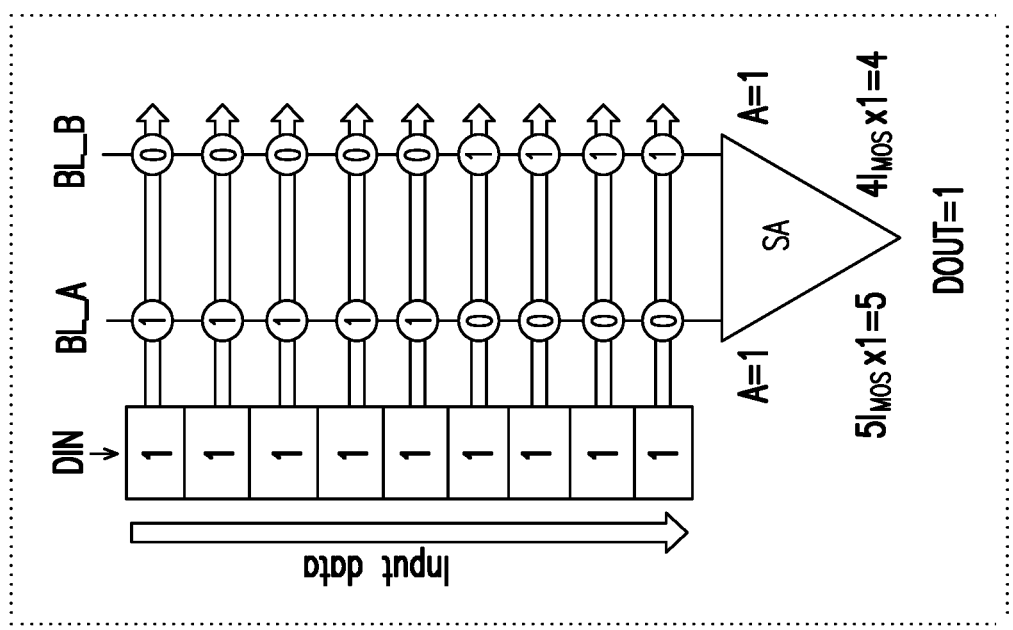

Reference will now be made in detail to the present exemplary embodiments of the disclosure, examples of which are illustrated in the accompanying drawings. Wherever possible, the same reference numbers are used in the drawings and the description to refer to the same or like parts.

This disclosure is directed to a memory circuit having a sense amplifier calibration mechanism. The purpose of calibrating a bitline of a memory circuit is to lock the SA which controls the bitline into a particular gain ratio (GR) which is the previously described characteristic drifting of a high performance CIM device having a large number of SAs operating in parallel. A locking code could be implemented to counter the GR characteristic drift, and a multi-input operation could be enabled during the CIM to enhance the reliability of the locking code generation. The SA circuit includes additional hardware configured to adjust a bias voltage source (or current) of a half-sensing circuit of the SA circuit, and the bias voltage source changes the proportion of the unit current produced per unit weight, thereby changing the complete SA GR transfer curve so as to calibrate or correct the bitline current of memory circuit.

By calibrating the bitline current of the memory circuit, the distribution range of the GR drifts among the SAs could be significantly narrowed so as to be entirely within the intended operating range. Thus, by adjusting bias voltage or current of the half-sensing circuit to change the proportion of the current generated by the weight of each unit memory element, the GR of the SA per memory column or row could be changed, thereby changing the complete SA BATC. As the calibration mechanism is able to narrow the distribution range of GR drifts among the SAs to be with an operable range, different chips may adjust its GRs to have the same range characteristics. By doing so, the GR drift problems of SA could be solved. Moreover, recalibration could be performed at any time to maintain the best accuracy of each of the chips. Furthermore, the technique of lock protection could be accomplished (only) by adjusting the lock code to release the GR random number lock, and subsequently the normal CIM operation mode can be entered upon the release of the GR random number lock.

Figure 5:
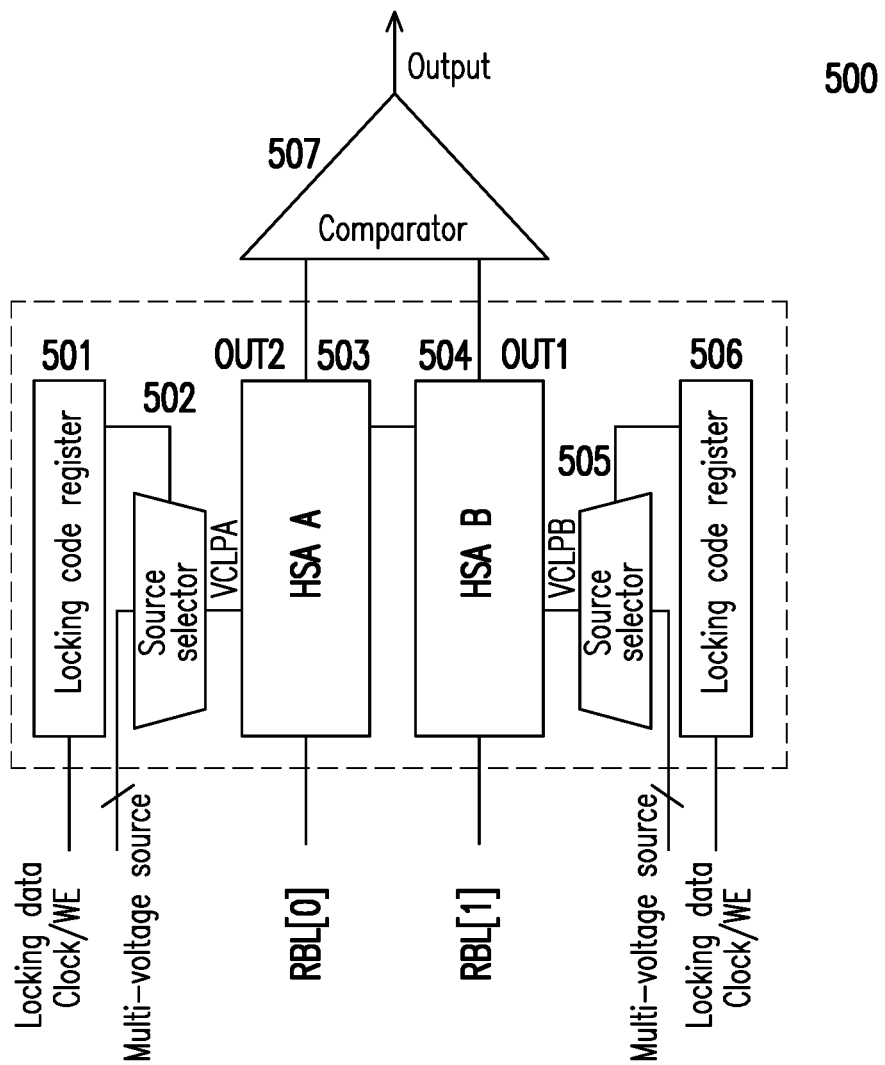
FIG. 5 illustrates a block diagram of a memory circuit having a sense amplifier calibration mechanism according to a first exemplary embodiment of the disclosure.

To elucidate the above-described inventive concepts, the disclosure provides several exemplary embodiments. FIG. 5 illustrates a block diagram of a memory circuit having a sense amplifier calibration mechanism according to a first exemplary embodiment of the disclosure. The memory circuit 500 has a complementary sensing structure and includes not limited to a first locking code register circuit 501, a first source selector circuit 502, a first half sense amplifier circuit 503, a second half sense amplifier circuit 504, a second source selector circuit 505, a second locking code register circuit 506, and a comparator 507 circuit. The first locking code register circuit 501 is configured to receive locking data which includes a locking code to calibrate the GR of the between the first half sense amplifier circuit 503 and the second half sense amplifier circuit 504.

The first half sense amplifier circuit 503 is connected to a first plurality of memory cells (e.g. 101) through a first bit line (e.g. RBL[0]) and configured to receive a unit of analog electrical signal from each of the first plurality of memory cells and to generate a first half sense amplifier output signal (e.g. Out2) corresponding to the first bit line (e.g. RBL[0]) based on a first gain of the first half sense amplifier and an accumulation of each of the unit of analog electrical signal from each of the first plurality of memory cells (e.g. 101). The first locking code register circuit 501 is electrically connected to the first half sense amplifier circuit 503 and configured to receive a locking data and to generate a digital locking sequence according to the locking data. The first source selector circuit 502 is connected to multiple voltage sources and is configured to receive the digital locking sequence and to generate, from the digital locking sequence, a first adjustment signal (e.g. VCLPA) to adjust the first half sense amplifier output signal (e.g. OUT2) by adjusting the first gain of the first half sense amplifier circuit 503.

It should be noted that the descriptions for the second half sense amplifier circuit 504, the second source selector circuit 505, and the second locking code register circuit 506 would be similar to the first half sense amplifier circuit 503, the first source selector circuit 502, and the first locking code register circuit 501 respectively and thus a repetition of the written description would not be necessary.

The comparator circuit 507 is configured to receive the first half sense amplifier output signal (e.g. Out2) corresponding to the first bit line (e.g. RBL[0]) and the second half sense amplifier output signal (e.g. Out1) corresponding to a second bit line (RBL[1]) to generate a single ternary weight value based on a comparison result of the first half sense amplifier output signal (e.g. Out2) and the second half sense amplifier output signal (e.g. Out1). Subsequently, a ratio between the first gain of the first half sense amplifier circuit 503 and the second gain of the second half sense amplifier circuit 504 is adjusted to be a predetermined ratio which could be ideally 1:1.

Each of the first and second locking code register circuits 501 506 includes a plurality of registers as each of the plurality of registers correspond to a binary digit of the digital locking sequence, and each would receive a clock signal to operate the plurality of registers. Each of the first and second source selector circuit 502 505 would include a decoder circuit configured to receive the digital locking sequence to generate a decoded signal, and a multiplexer which receives the decoded signal to select the first adjustment signal from a plurality of discrete first adjustment signals based on the decoded signal.

Figure 6:
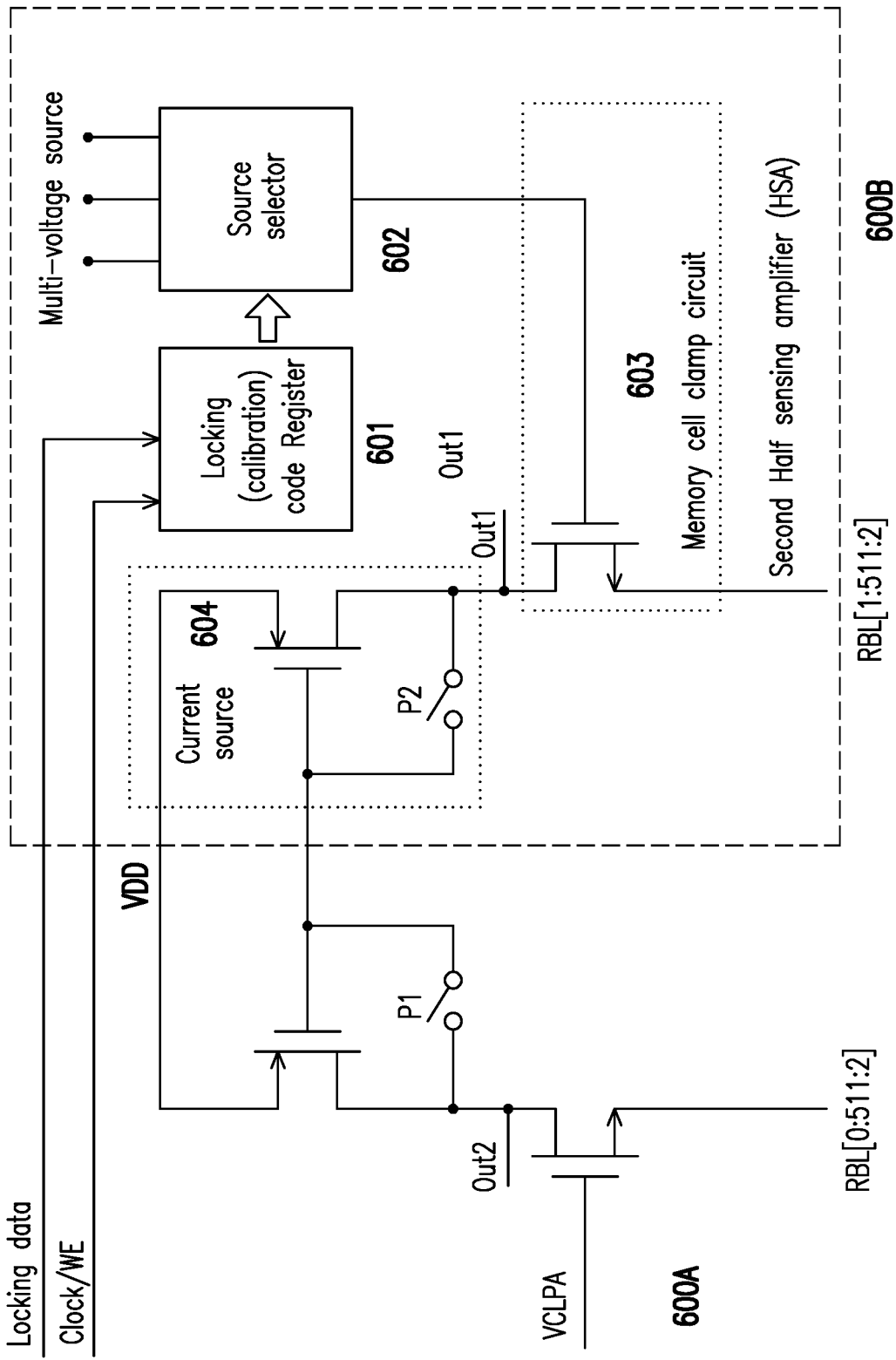
FIG. 6 illustrates the memory circuit of FIG. 5 with further details according to the first exemplary embodiment of the disclosure.

The more detailed description of FIG. 5 is provided in the next few figures and their corresponding written descriptions. FIG. 6 shows a more detailed circuit diagram of FIG. 5. The memory circuit of FIG. 6 includes a first half sense amplifier circuit 600A and a second half sense amplifier circuit 600B. The structure of the first half sense amplifier circuit 600A is identical to the second half sense amplifier circuit 600B and for the purpose of brevity, the details of the first half sense amplifier circuit 600A is not shown. Also, the locking code register circuit 601 is identical to the second locking code register circuit 506 of FIG. 5, the source selector circuit 602 is identical to the second source selector circuit 505. The memory cell clamp circuit 603 is configured to receive, from the source selector circuit 602, the VLCPB voltage (i.e. first adjustment signal) to generate a first half sense amplifier output signal (i.e. Out1) based on the first gain.

More specifically, the memory cell clamp circuit 603 may include a N-type metal oxide semiconductor field effect transistor (MOSFET) for which the gate terminal receives the VLCPB voltage from the source selector circuit 602, and the VLCPB voltage controls the current flowing through the drain terminal and the source terminal of the N-type MOSFET transistor. Further, the drain terminal of the N-type MOSFET transistor is the connected to the first half sense amplifier output (i.e. Out1) which is connected to the drain terminal of the current source circuit 604 of the second half sense amplifier circuit 600B. The current source circuit 604 could be a P-type MOSFET transistor with the drain terminal connected to the memory cell clamp circuit 603, the gate terminal connected to the second half sense amplifier circuit 600B and a switch PS2 which is connected to the drain terminal and the gate terminal, and the source terminal connected to a power supply voltage (i.e. $V_{DD}$).

The memory circuit 600 of FIG. 6 would be able to calibrate the sense amplifier circuit 600A 600B by connecting to the proper the bias voltage sources out of a plurality of bias voltage sources via the respective source selector circuit (e.g. 602) so as to change the proportion of the current generated by the sum of the units of electrical current from each of the first plurality of memory cells (e.g. 101) as well as the proportion of the current generated by the sum of the units of electrical current from each of the second plurality of memory cells (e.g. 102) thereby changing the overall SA transfer curve.

In FIG. 5, RBL[0], RBL[1] are two different bit lines, and the complementary weights of RBL[0] and RBL[1], being (0,1) and (1,0) respectively, represent a single Weight +1, −1, in a normal operation. As previously described an accumulated weight of RB[0] refers to an accumulation of units of analog electrical signal from each of a first plurality of memory cells modified by a first gain of a first half sense amplifier circuit, and the output of the first half sense amplifier circuit is on Out2. Similarly, an accumulated weight of RB[1] refers to an accumulation of units of analog electrical signal from each of a second plurality of memory cells modified by a second gain of a second half sense amplifier circuit, and the output of the second half sense amplifier circuit is on RB[1]. When the accumulated weight of one of the RBL[0] and RBL[1] is greater than the other, a corresponding default value will be the output. For example, as shown in FIG. 7, when the accumulated weight of RBL[1] is greater than the accumulated weight of RBL[0], the output of the comparator circuit (e.g. 507) is 1, and when the accumulated weight of RBL[1] is less than the accumulated weight of RBL[0], the output of the comparator circuit (e.g. 507) is 0.

In a normal operation, assuming that HSA A and B the amplification value, GN, (i.e. first gain) of the first half sense amplifier (i.e. HSA A) and the amplification value, GP, (i.e. second gain) of the second sense amplifier (i.e. HSA B) are completely identical such that the gain ratio=GN/GP=1, then the situation would be ideal without any problems. This means that the VCLPA in FIG. 5 and FIG. 6 would be will selected to be the same voltage as VCLPB making the current or voltage of RBL[0] and RBL[1] generated per unit weight being the same according to a 1:1 relationship. Each additional unit weight could be, for example, 1 micro-amp (uA). Under such circumstance, the SA transfer curve would be curve 701 as GN=GP.

Figure 3:
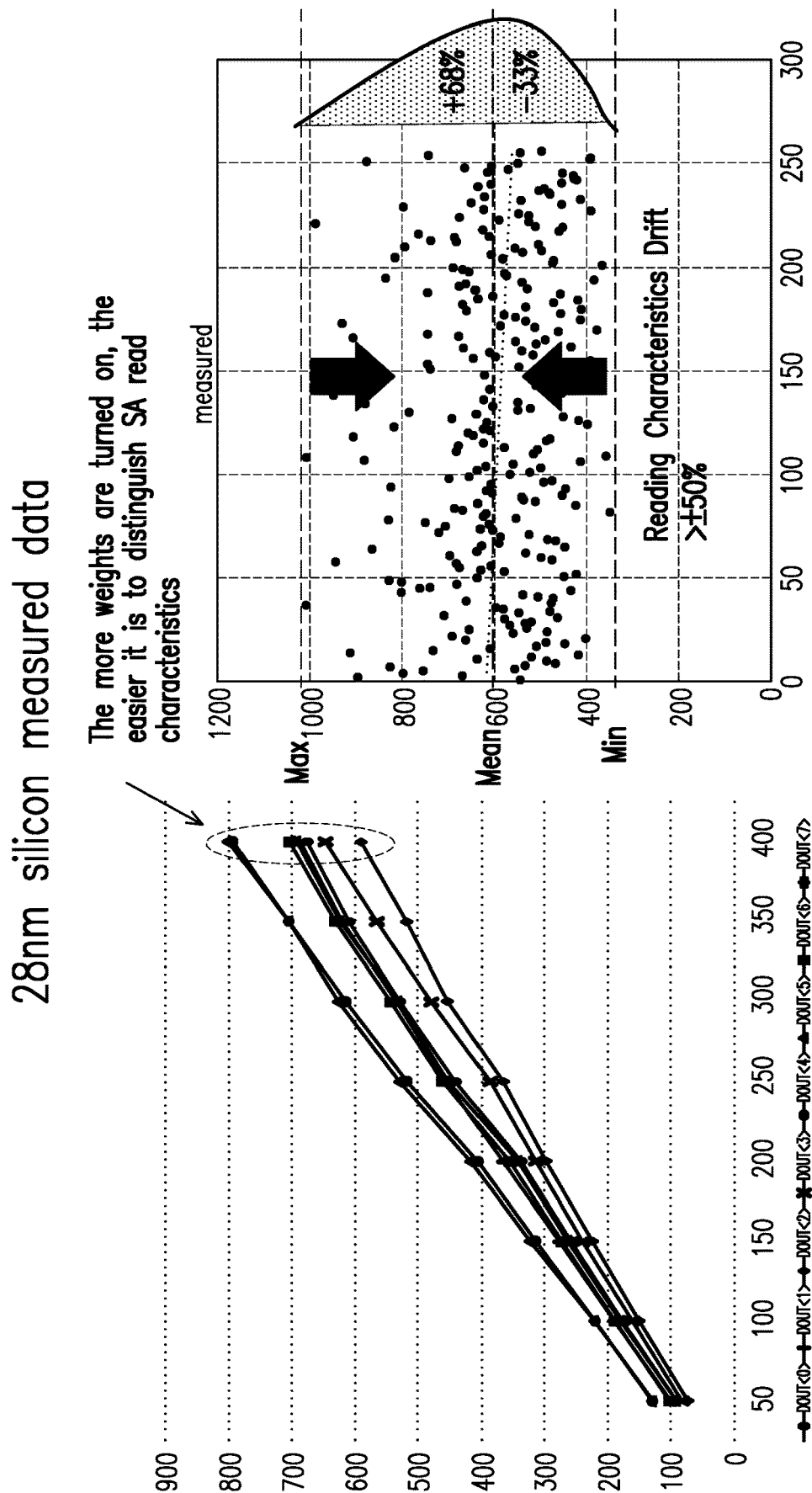
FIG. 3 illustrates a distribution of binary activation transfer curve (BATC) results for a 28 nm chip in CIM operation.
Figure 4:
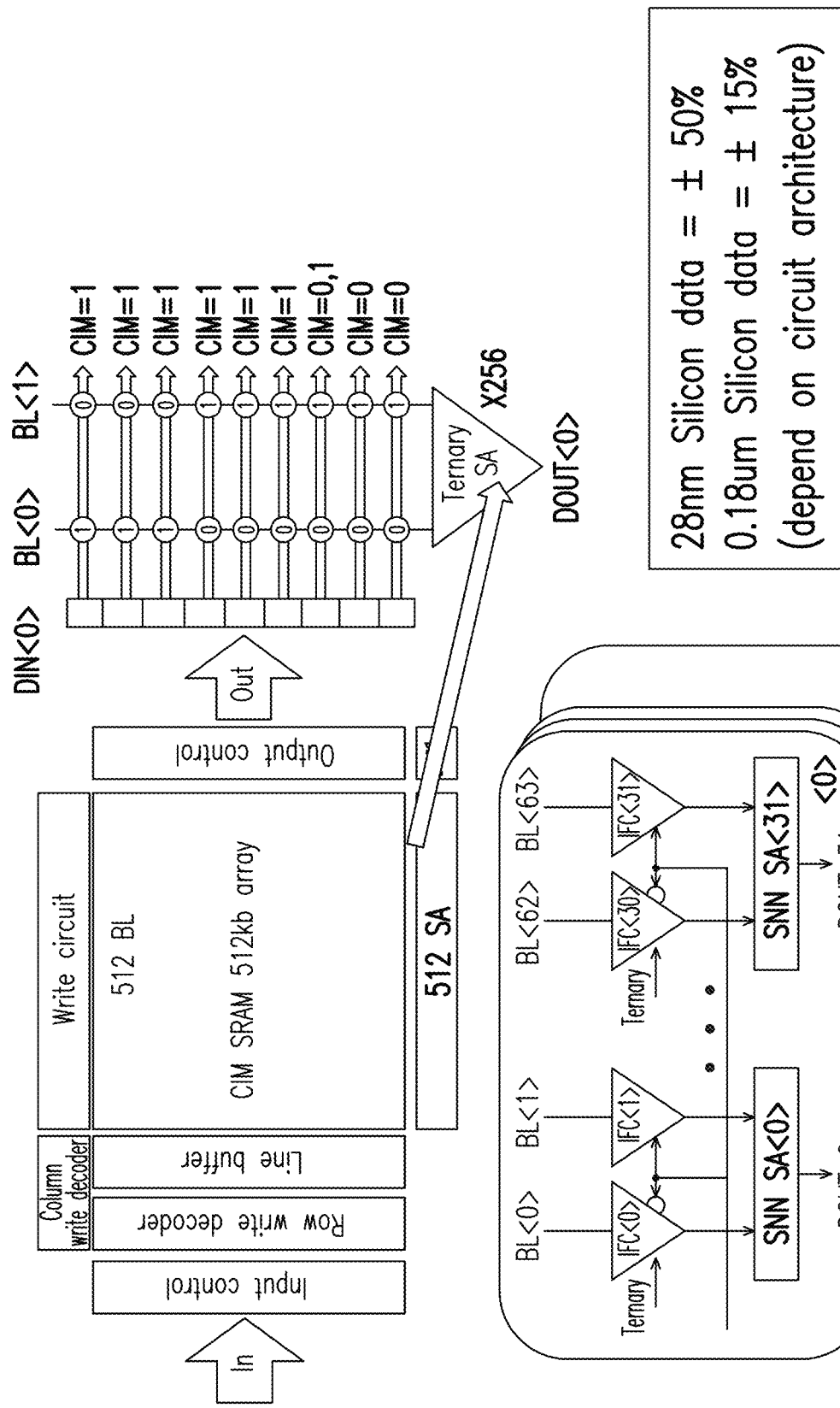
FIG. 4 illustrates a memory circuit architecture which utilizes a large quantity of SA circuits operating in parallel.

However, since the magnification ratio of HSA A and B would not be completely symmetrical (GR≠1) in real life, it is impossible to predict which side of HSA A or HSA B will have a larger magnification ratio. As shown in FIG. 3, the SAs of different groups of bit lines have different GRs for 256 groups CIM SA measurement results. Because this conversion curve BATC represents an overall weight conversion, it includes two types of errors which are an offset error and a gain error, and a conventional compensation method would typically compensate for the offset error but not for the gain error; thus, it would be impossible to correctly compensate the CIM SA operation. In this disclosure, the overall gain error compensation is performed by scaling the unit weight corresponding to the unit current, that is, the original 1 uA increase of each weight is uniformly reduced to 0.9 uA as an example or uniformly increased to 1.1 uA as an example so as to change the overall GR conversion curve.

Figure 7:
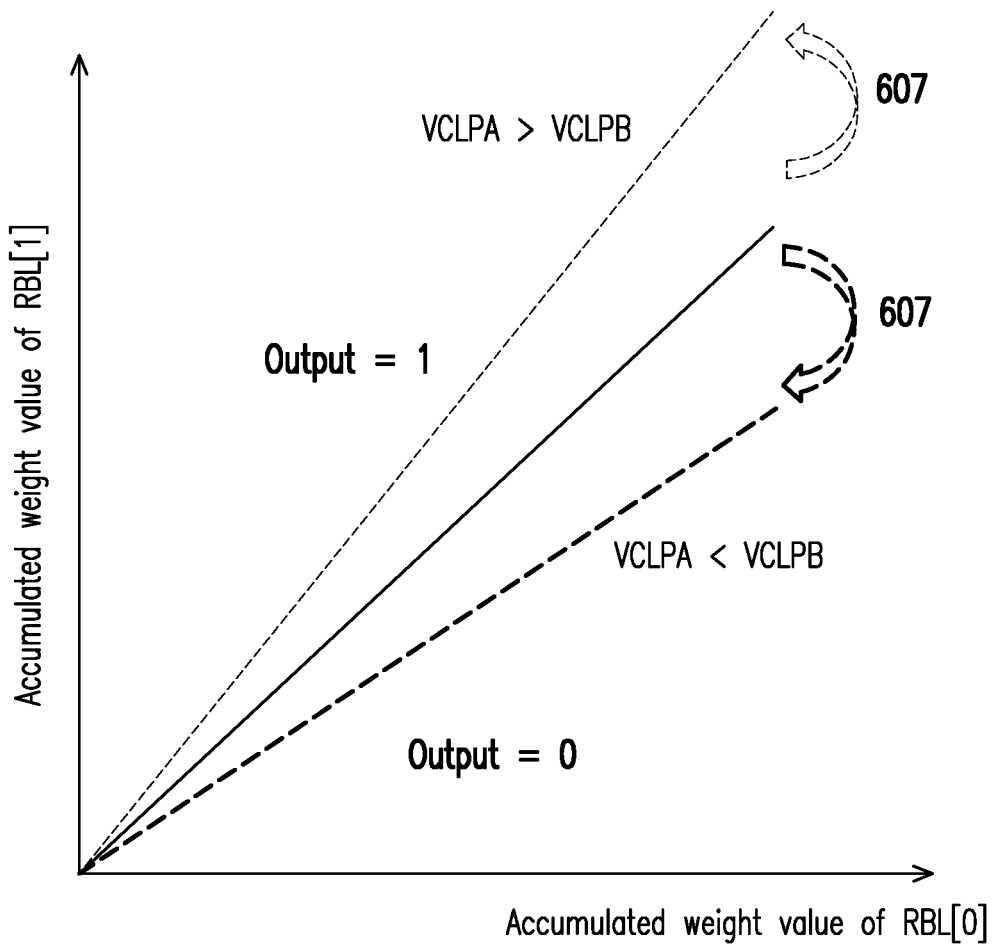
FIG. 7 illustrates a SA BATC for determining a SA output result according to an exemplary embodiment of the disclosure.

As shown in FIG. 7, when VCLPA is greater than VCLPB, the conversion curve can be moved up from 701 to 702. When VCLPA is less than VCLPB, the conversion curve can be moved down from 701 to 703. By knowing this, the CIM SA group that originally deviated from the ideal conversion curve can be corrected back to the ideal curve. Although a CIM chip has a large number of SAs operating in parallel, each of the locking code registers in a group of HSA A's could be collectively calibrated so that its distribution of SA transfer curves could be calibrated to be within a tolerable range, and also the same could be applied to each of the locking code registers in a group of HSA B's. Each of the locking code registers would be able to store its own individual code in a non-volatile memory in order to calibrate the gains of each of the SAs.

Figure 8:
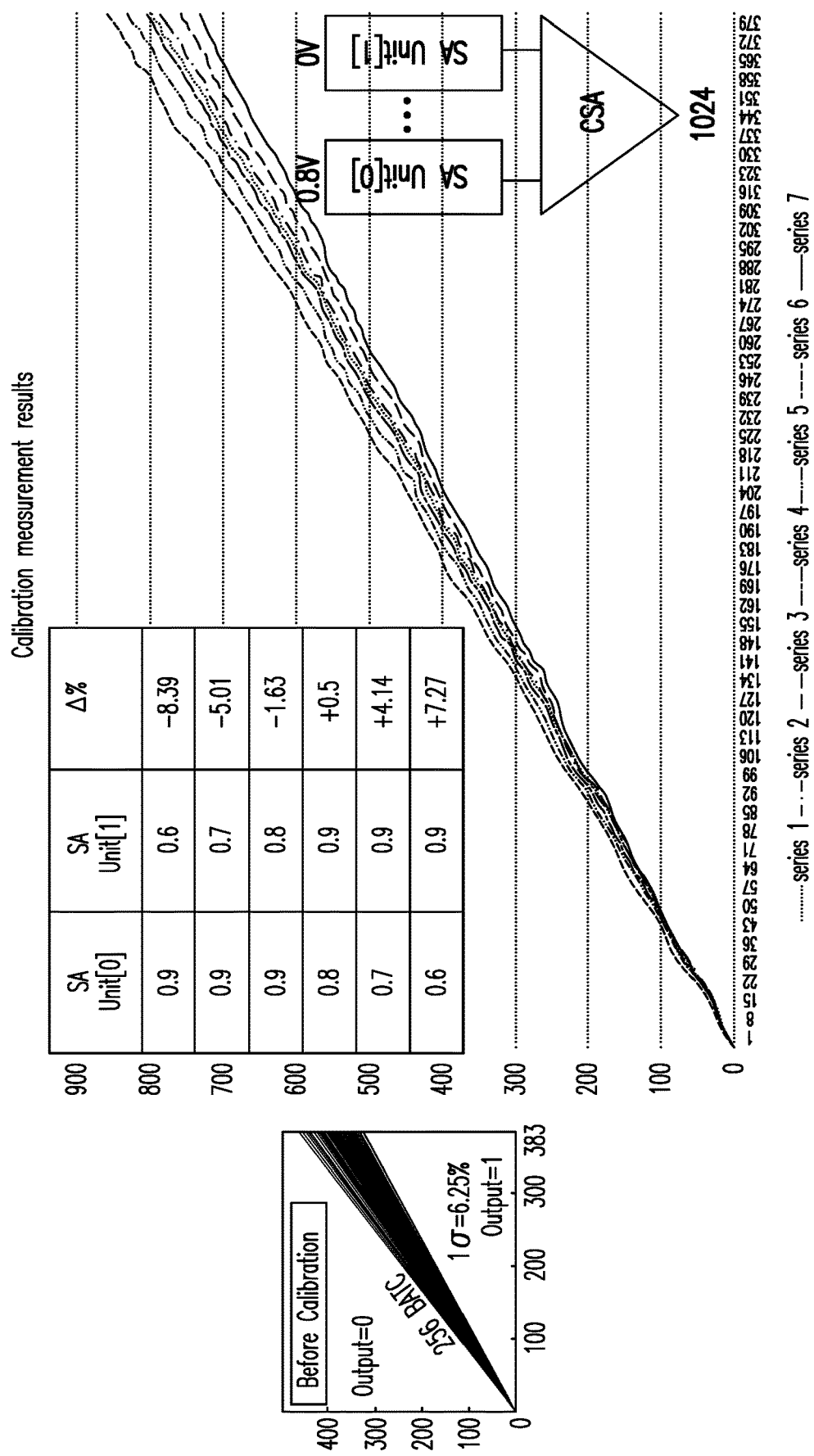
FIG. 8 illustrates a comparison between two different distributions of binary BATC results which are before performing the calibration mechanism and after performing the calibration mechanism according to an exemplary embodiment of the disclosure.

A comparison between a distribution of BATC results 801 before performing the calibration mechanism and a distribution of BATC results 801 after performing the calibration mechanism is shown in FIG. 8. In the calibrated measurement result 802, each set of SAs includes two sets of HSAs. When the VCLPs of the two HSAs have been changed, the SATC slope, which is the gain ratio (GR), can be changed. The actual magnitude of adjustment is also shown in the table of FIG. 8. As shown in the table of FIG. 8, using 0.6-0.9V can affect the GR offset to be about ±8%. In this way, the GR of any half sense amplifier could be adjusted to have a required slope.

Figure 9:
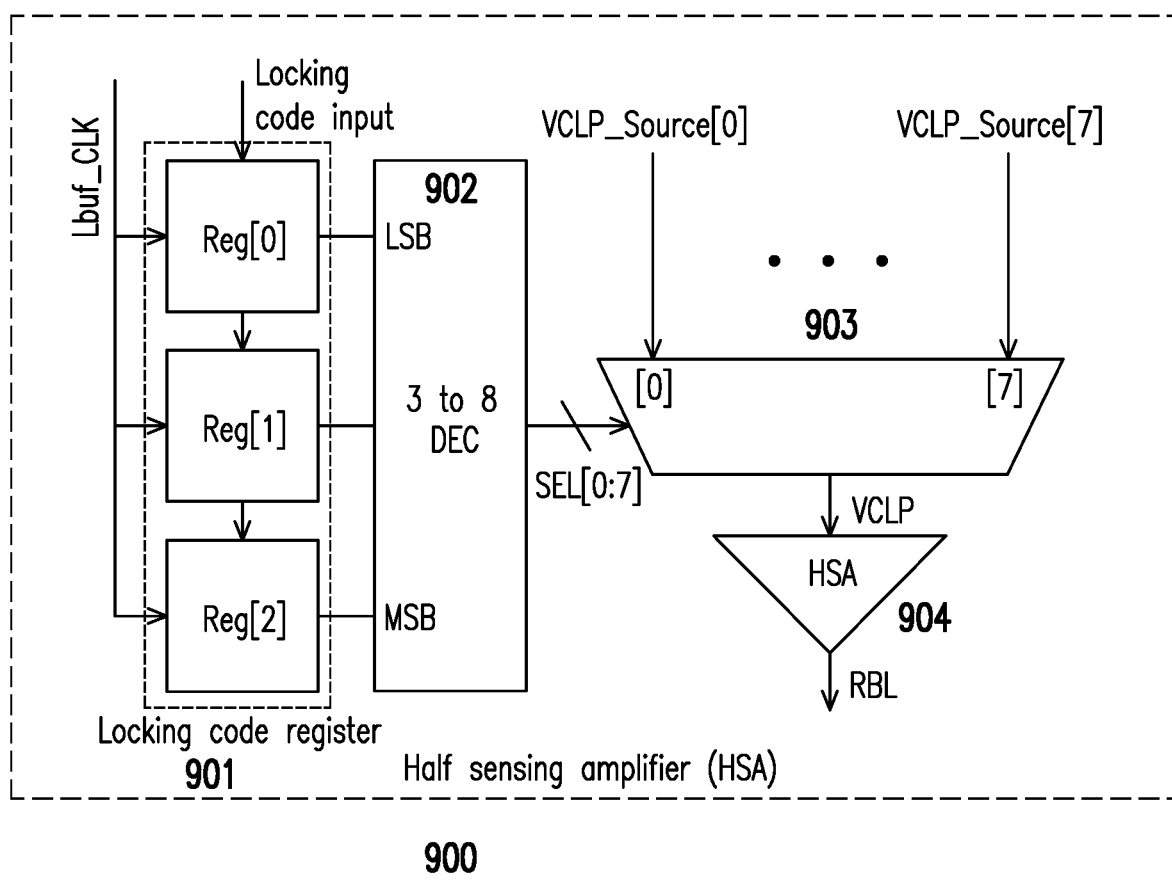
FIG. 9 illustrates a detailed hardware diagram of a locking code register circuit and a source selector circuit according to the first exemplary embodiment of the disclosure.

FIG. 9 illustrates a detailed hardware diagram of a locking code register circuit and a source selector circuit according to the first exemplary embodiment of the disclosure. As previously shown in FIG. 5, the locking code register circuit 901 would receive a locking data (i.e. locking code input), word line enable signal, and a clock. The locking code register circuit 901 includes a plurality of registers (REG[0], REG[1], REG[2], etc.) as each of the plurality of registers would receive a respective bit of the locking code input and would output a corresponding binary digit of a digital locking sequence to be generated and provided to a source selector circuit.

The source selector circuit includes a decoder circuit 902 and a multiplexer 903. The decoder circuit 902 is configured to receive the digital locking sequence to generate a decoded signal. In the example of FIG. 8, the decoder circuit 902 is a 3 to 8 decoder, thus the decoder circuit 902 decodes from the digital locking sequence which is a 3-bit binary sequence into a decoded signal which is 1 of 8 discrete possibilities. The multiplexer 903 would receive the decoded signal to select 1 of 8 different VLCP voltage sources as an (first/second) adjustment signal based on the decoded signal. The half sense amplifier (e.g. HSA A or HSA B) would receive the VLCP voltage (e.g. VLCPA or VLCPB) to control its memory cell clamp circuit (e.g. 603).

Figure 10:
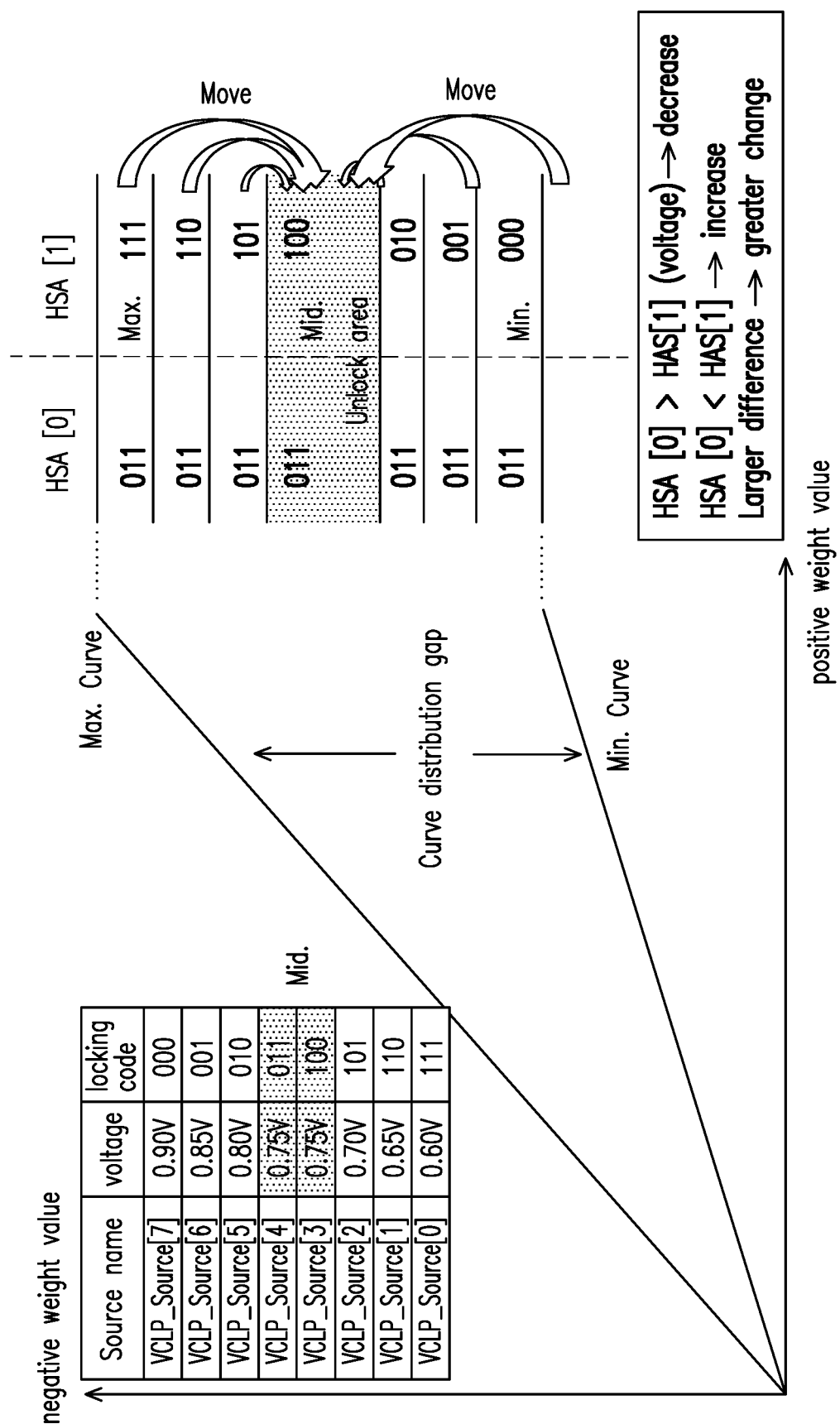
FIG. 10 illustrates using locking code to change the SA transfer curve according to a first exemplary embodiment of the disclosure.

FIG. 10 shows using a locking code to select a corresponding VLCP voltage so as to obtain the required slope of FIG. 10. As shown in the table of FIG. 10, assuming that the locking code input is '100', the voltage source corresponding to VLCP_source [3] which is 0.75V, is selected; assuming that the locking code input is '011', the voltage source corresponding to VLCP_source [4] which is 0.75V, is selected; and so forth. If the gain of HSA A is greater than the gain of HSA B, then the gain of HSA could be adjusted to be lower. If the gain of HSA A is lower than the gain of HSA B, then the gain of HSA could be adjusted to be high. In general, the bigger difference between the gains of HSA A and HSA B is, the larger than adjustment. It should be noted that theoretically using a higher number of bits as the locking code input may result in a higher accuracy. Even though a 3 bit combination is shown as an example, the disclosure is not limited to using 3 bits.

Figure 11:
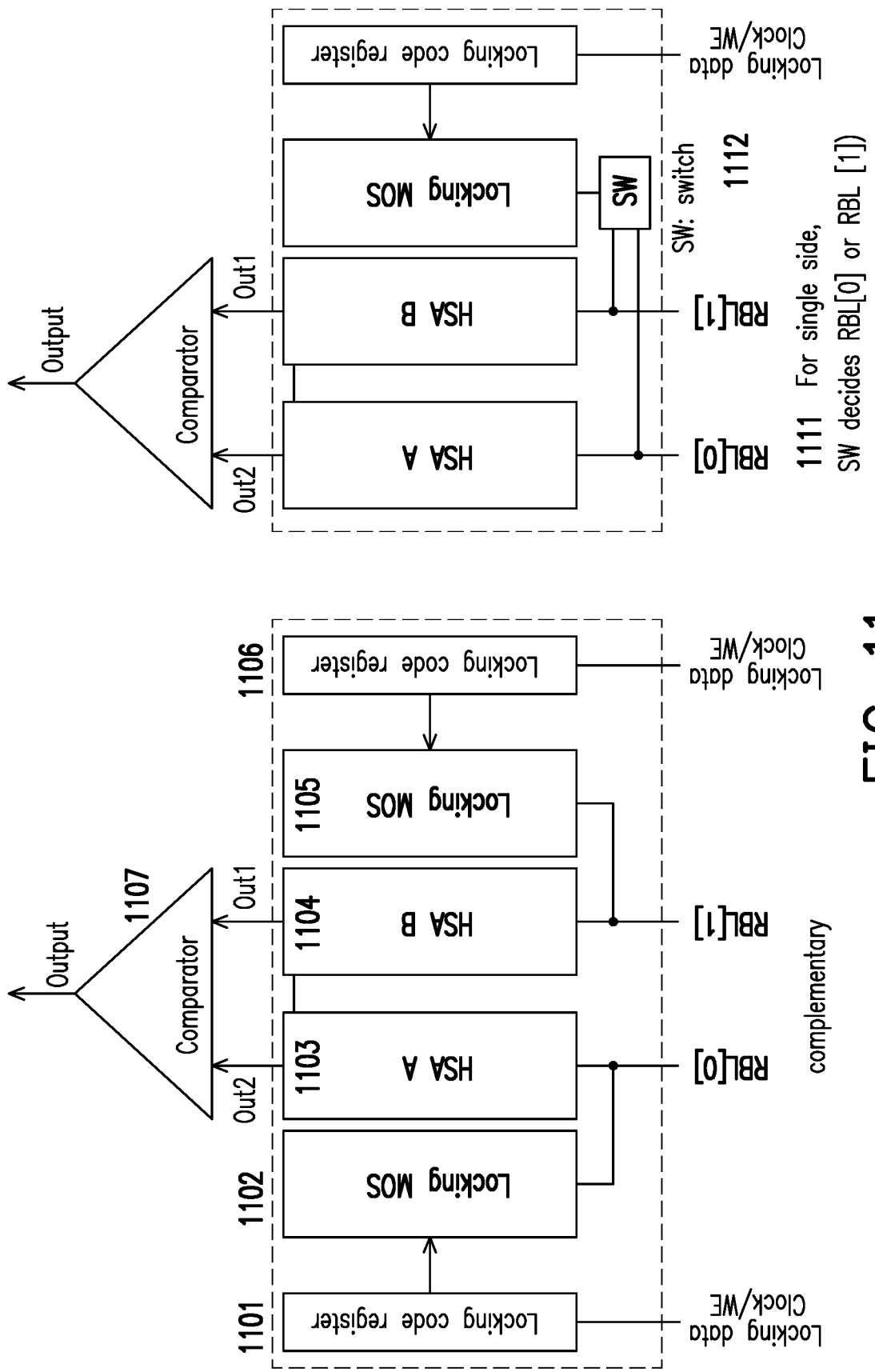
FIG. 11 illustrates a block diagram of a memory circuit having a sense amplifier calibration mechanism according to a second exemplary embodiment of the disclosure.

FIG. 11 illustrates a block diagram of a memory circuit having a sense amplifier calibration mechanism according to a second exemplary embodiment of the disclosure. For the second exemplary embodiment, one of the main differences is the implementation of the locking transistor circuit 1105 in place of the source selector circuit. The memory circuit 1100 includes a first locking code register circuit 1101, a first locking transistor circuit 1102, a first half sense amplifier circuit 1103 (i.e. HSA A), a second half sense amplifier circuit 1104 (i.e. HSA B), a second lock transistor circuit 1105, and a second locking code register circuit 1106.

The first half sense amplifier circuit 1103 is connected to a first plurality of memory cells (e.g. 101) through a first bit line (RBL[0]) and configured to receive a unit of analog electrical signal from each of the first plurality of memory cells (e.g. 101) and to generate a first half sense amplifier output signal (Out2) corresponding to the first bit line (RBL[0]) based on a first gain of the half sense amplifier 1103 and an accumulation of each of the unit of analog electrical signal from each of the first plurality of memory cells (e.g. 101). The first locking code register circuit 1101 is electrically connected to the first half sense amplifier circuit 1103 and configured to receive a locking data and to generate a digital locking sequence according to the locking data. The first locking transistor circuit 1102 is configured to receive the digital locking sequence and to generate, from the digital locking sequence, a first current signal having a first gain as the level of the first current signal is proportional to a binary value of the digital locking sequence. The descriptions for the second half sense amplifier circuit 1104, the second lock transistor circuit 1105, and the second locking code register circuit 1106 are the similar to its counter parts and thus a repeat of the description is not necessary.

It should be noted that, referring to FIG. 11, while the memory circuit 1100 adopts a complementary architecture, a memory circuit 1111 of a single ended (non-complementary) architecture is also possible. For the memory circuit 1111, a switch 1112 would be necessary to turn on either RBL[0] or RBL[1].

Figure 12:
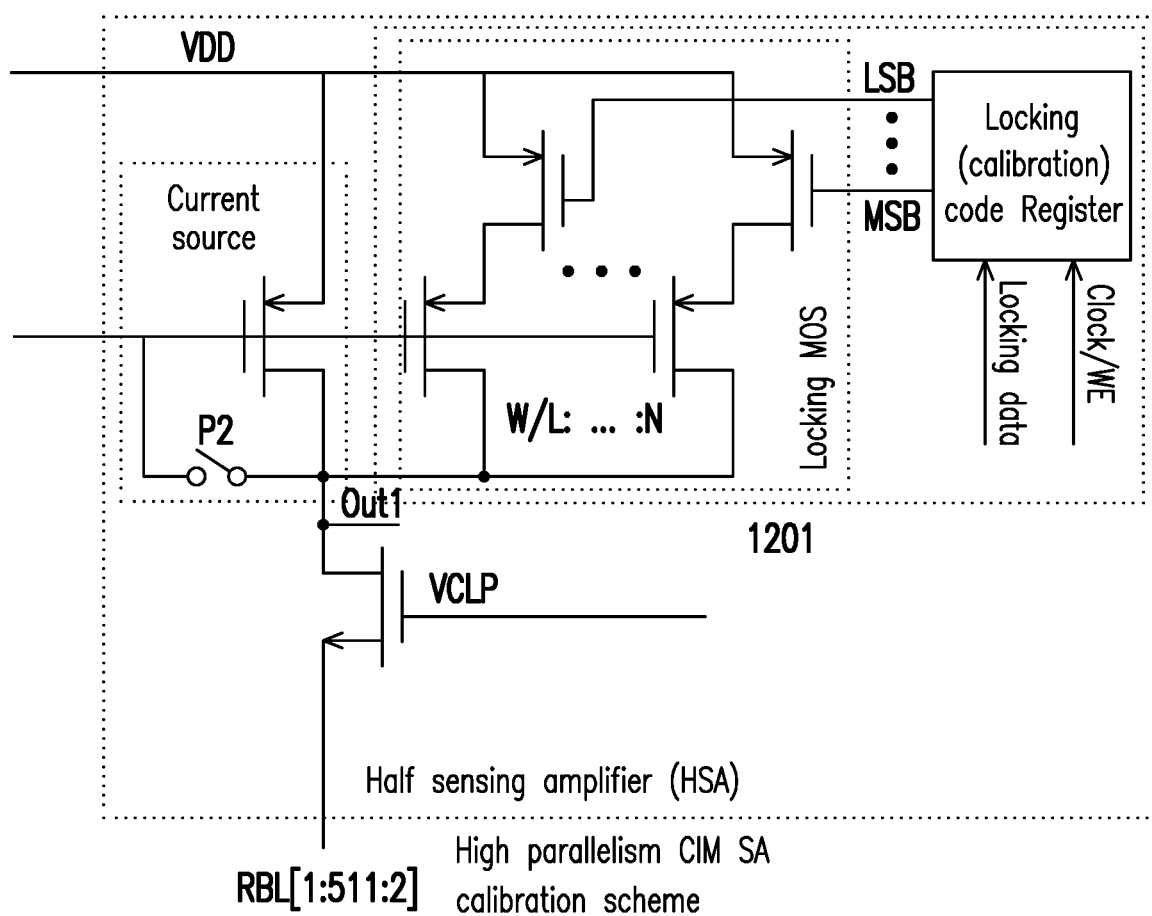
FIG. 12 illustrates the memory circuit of FIG. 12 with further details according to the second exemplary embodiment of the disclosure.

A more detailed circuit diagram for the second exemplary embodiment is shown in FIG. 12. The principle of operation of the circuit of the second exemplary embodiment is quite similar to the principle of operation of the circuit of the first exemplary embodiment, and thus a repetition is not necessary. As for the locking transistor circuit (e.g. 1102 1105), it includes multiple sets of current mirrors. Each of the plurality of current mirrors is respectively connected to each of the plurality of registers of the first/second locking code register circuit 1101 1106 as each of the plurality of registers turns on or off a different one of the plurality of current mirrors so as to set the overall current in the output (e.g. Out1) of the half sense amplifier circuit 1200. Each of the plurality of current mirrors may include a P-type transistor (e.g. 1202), and the gain of the half sense amplifier circuit 1200 could be determined based on the width to length (W/L) ratio of the composite P-type MOS (PMOS) transistors of the plurality of current mirrors.

Thus, under the same concept as previously described, the highly parallel CIM SA calibration technique could be achieved by controlling the current source W/L ratio of two half SAs. As two HSAs form a current mirror sense amplifier architecture, one side of the Phase switch (P2) is turned on while the other side is turned off while the PMOS transistors (e.g. 1202) of the two HSAs would determine the current ratio of the two sides. In this exemplary embodiment, the overall W/L could be designed to be a ratio, and the locking transistor circuit 1102 would be used to adjust the W/L ratio by turning on or off each of the MOS transistors according to the locking data of the locking code register circuit 1101 1106, and thus the W/L of the composite P-type PMOS transistors could be changed to change the GR of the SA so to achieve the same function and effect as the first exemplary embodiment.

Figure 13:
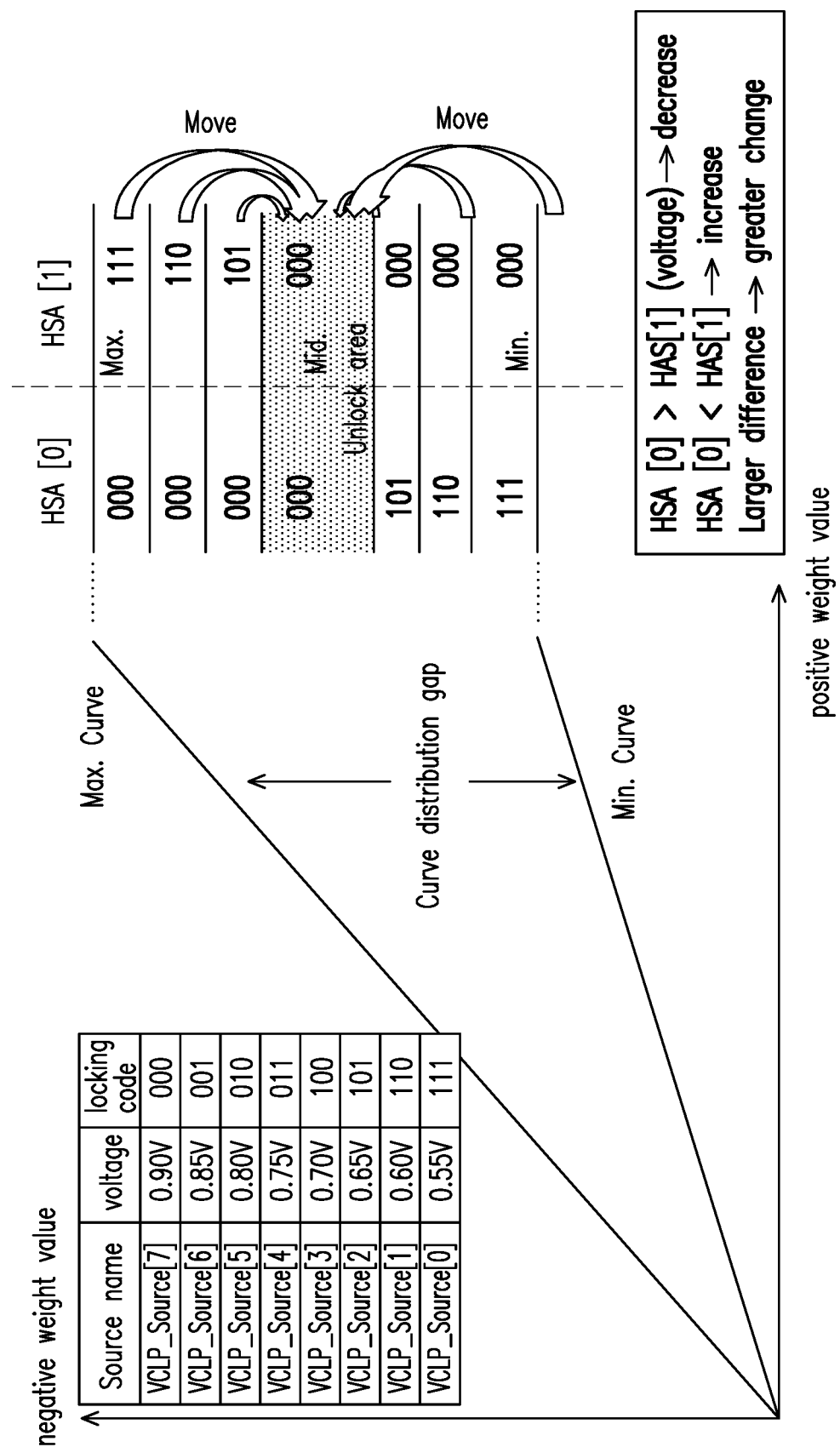
FIG. 13 illustrates using locking code to change the SA transfer curve according to a second exemplary embodiment of the disclosure.

The exact technique of using the locking code to change the SA transfer curve for the second exemplary embodiment is similar to the first exemplary embodiment. As shown in the table of FIG. 13, the three bits locking code could be output by the locking code register circuit (e.g. 1101 1106) to turn on or off each set of current mirrors in the locking transistor circuit (e.g. 1102 1105) so as to result in a particular VLCP voltage. For example, assuming that the locking code input is '100', the voltage source corresponding to VLCP_source [3] which is 0.70V, is output by the locking transistor circuit (e.g. 1102 1105); assuming that the locking code input is '011', the voltage source corresponding to VLCP_source [4] which is output by the locking transistor circuit (e.g. 1102 1105); and so forth. Even though a 3 bit combination is shown as an example, the disclosure is not limited to using 3 bits.

Figure 14:
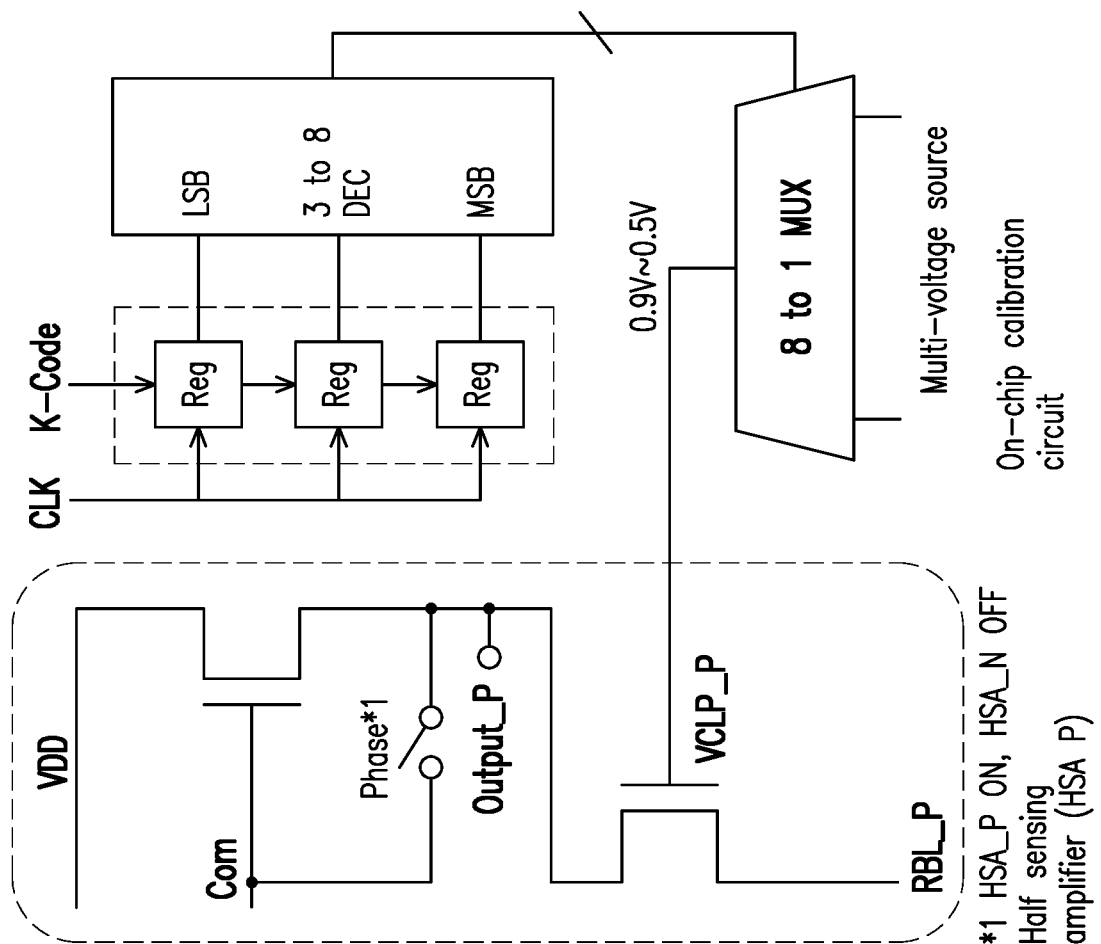
FIG. 14 illustrates a comprehensive block diagram of a sense amplifier with an on-chip calibration circuit according to an exemplary embodiment of the disclosure.
Figure 14:
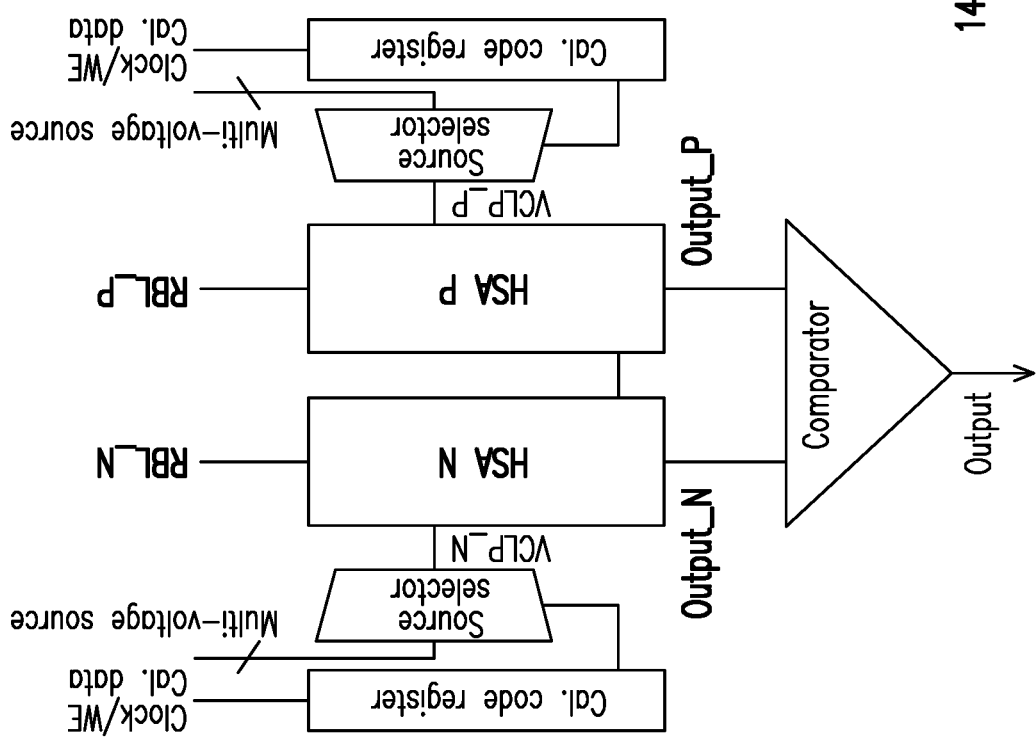

A comprehensive block diagram of a sense amplifier with an on-chip calibration circuit is shown in FIG. 14. In general, the sense amplifier circuit may include two half sense amplifier circuits (HSA N, HSA P). According to an exemplary embodiment, each set of the two half sense amplifier circuits could be a sense amplifier circuit, but each half sense amplifier circuit would include on on-chip calibration circuit which could be equivalent to the first/second locking code register circuit and the first/second source selector circuit or the first/second locking transistor circuit as previously described. If the HSA P 1401 is turn on by the phase 1 switch, then the HSA N would be turned off.

Figure 15:
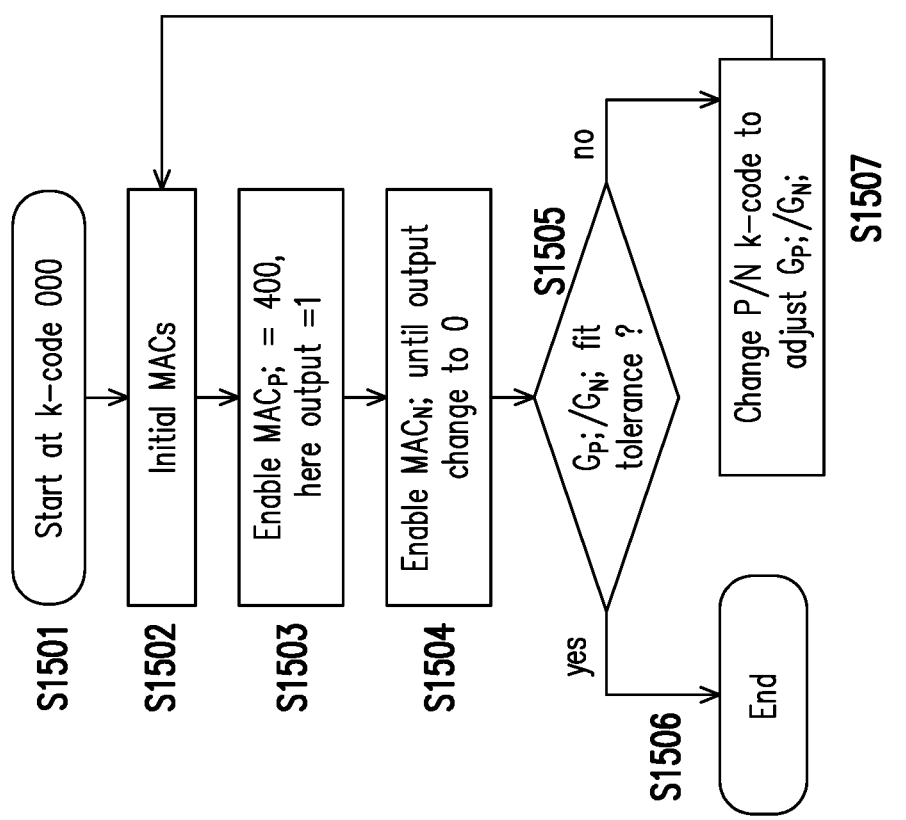
FIG. 15 illustrates a flow chart which illustrates a calibration process using a locking code according to an exemplary embodiment of the disclosure.

The calibration process using a locking code is shown in FIG. 15. The process of FIG. 15 could be used to calibrate the GR of each of a half sense amplifier in order that SA transfer curve could be moved from a non-ideal curve into an ideal curve. Referring to FIG. 15, in step S1501, the process would start K-code at 000. In step S1502, the MACs are being initiated. In step S1503, positive RBL MAC number (MACp) is set as 400 so that the output of a set of sense amplifier is 1. In step S1504, negative RBL MAC number (MACN) is enabled so that the output of a set of sense amplifier is 0. In step S1505, the process would determine whether a ratio between a first gain (GP) of a first half sense amplifier and a second gain (GN) of a second half sense amplifier is a number that is within a predetermined tolerance. If yes, then the process would end. If no, then in step S1506, the locking code of the first sense amplifier and the second sense amplifier are changed so that the ratio between a first gain (GP) of a first half sense amplifier and a second gain (GN) of a second half sense amplifier is a number that is within a predetermined tolerance. In general, the ratio could be adjusted as, for example, a 1:1 ratio either by increasing or decreasing the first gain or by increasing or decreasing the second gain.

In according to an exemplary embodiment, the SA calibration mechanism could be performed while the chip is still in a manufacturing facility or could be performed on a on-chip processor (not shown) to dynamically adjust the SAs while the chip is in use.

In according to an exemplary embodiment, the first exemplary embodiment and the second exemplary embodiment could be compatible and simultaneously implemented as the first/second source selector circuit could be used to determine the VLCPA or VCLPB voltage while the first/second locking transistor circuit could be used to determine the current on the output of the half sense amplifier circuit.

In view of the aforementioned descriptions, the present disclosure is suitable for being used in a in-memory computing chip and could be used for chip lock protections and SA calibrations.

No element, act, or instruction used in the detailed description of disclosed embodiments of the present application should be construed as absolutely critical or essential to the present disclosure unless explicitly described as such. Also, as used herein, each of the indefinite articles "a" and "an" could include more than one item. If only one item is intended, the terms "a single" or similar languages would be used. Furthermore, the terms "any of" followed by a listing of a plurality of items and/or a plurality of categories of items, as used herein, are intended to include "any of", "any combination of", "any multiple of", and/or "any combination of multiples of the items and/or the categories of items, individually or in conjunction with other items and/or other categories of items. Further, as used herein, the term "set" is intended to include any number of items, including zero. Further, as used herein, the term "number" is intended to include any number, including zero.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A memory circuit comprising:
a first half sense amplifier circuit connected to a first plurality of memory cells through a bit line and configured to receive a unit of analog electrical signal from each of the first plurality of memory cells and to generate a first half sense amplifier output signal corresponding to the first bit line based on a first gain of the half sense amplifier by multiplying an accumulation of each of the unit of analog electrical signal from each of the first plurality of memory cells with the first gain,
a locking code register circuit electrically connected to the first half sense amplifier circuit and configured to receive a locking data and to generate a digital locking sequence according to the locking data, and
a source selector circuit configured to receive the digital locking sequence and to generate, from the digital locking sequence, a first adjustment signal to adjust the first half sense amplifier output signal corresponding to the first bit line by adjusting the first gain of the half sense amplifier.

2. The memory circuit of claim 1 further comprising:
a memory cell clamp circuit configured to receive the first adjustment signal to generate the first half sense amplifier output signal based on the first gain.

3. The memory circuit of claim 2 further comprising:
a second half sense amplifier circuit connected to a second plurality of memory cells through a second bit line and configured to receive a unit of analog electrical signal from each of the second plurality of memory cells and to generate a second half sense amplifier output signal corresponding to the second bit line based on a second gain of the half sense amplifier and an accumulation of each of the unit of analog electrical signal from each of the second plurality of memory cells.

4. The memory circuit of claim 3 further comprising:
a comparator circuit configured to receive the first half sense amplifier output signal corresponding to the first bit line and the second half sense amplifier output signal corresponding to a second bit line to generate a single ternary weight value based on a comparison result of the first half sense amplifier output signal corresponding to the first bit line and the second half sense amplifier output signal corresponding to the second bit line.

5. The memory circuit of claim 4, wherein a ratio between the first gain of the first half sense amplifier and the second gain of the second half sense amplifier is adjusted to be a predetermined number which is a rational number greater than zero.

6. The memory circuit of claim 5, wherein the ratio between the first gain of the first half sense amplifier and the second gain of the second half sense amplifier is adjusted to be a one to one.

7. The memory circuit of claim 1, wherein the locking code register circuit comprises a plurality of registers as each of the plurality of registers correspond to a binary digit of the digital locking sequence and further receives a clock signal to operate the plurality of registers.

8. The memory circuit of claim 7, wherein the source selector circuit comprises
a decoder circuit configured to receive the digital locking sequence to generate a decoded signal, and
a multiplexer which receives the decoded signal to select the first adjustment signal (VCLP) from a plurality of discrete first adjustment signals based on the decoded signal.

9. The memory circuit of claim 3, wherein the memory cell claim circuit comprises a transistor configured to receive the first adjustment signal and to generate a current as the first half sense amplifier output signal corresponding to the first bit line based on the first adjustment signal.

10. The memory circuit of claim 9, wherein the first half sense amplifier circuit comprises a current source circuit with a first terminal connected to the memory cell clamp circuit, a second terminal connected to the second half sense amplifier circuit and a switch which is connected to the first terminal and the second terminal, and a third terminal connected to a power supply voltage.

11. A memory circuit comprising:
a first half sense amplifier circuit connected to a first plurality of memory cells through a first bit line and configured to receive a unit of analog electrical signal from each of the first plurality of memory cells and to generate a first half sense amplifier output signal corresponding to the first bit line based on a first gain of the half sense amplifier and an accumulation of each of the unit of analog electrical signal from each of the first plurality of memory cells,
a locking code register circuit electrically connected to the first half sense amplifier circuit and configured to receive a locking data and to generate a digital locking sequence according to the locking data, and
a locking transistor circuit configured to receive the digital locking sequence and to generate, from the digital locking sequence, a first current signal having a first gain as the level of the first current signal is proportional to a binary value of the digital locking sequence.

12. The memory circuit of claim 11 further comprising:
a memory cell clamp circuit configured to receive the first current signal to generate the first half sense amplifier output signal based on the first gain.

13. The memory circuit of claim 12 further comprising:
a second half sense amplifier circuit connected to a second plurality of memory cells through a second bit line and configured to receive a unit of analog electrical signal from each of the second plurality of memory cells and to generate a second half sense amplifier output signal corresponding to the second bit line based on a second gain of the half sense amplifier and an accumulation of each of the unit of analog electrical signal from each of the second plurality of memory cells.

14. The memory circuit of claim 13 further comprising:
a comparator circuit configured to receive the first half sense amplifier output signal corresponding to the first bit line and the second half sense amplifier output signal corresponding to second bit line to generate a single ternary weight value based on a comparison result of the first half sense amplifier output signal corresponding to the first bit line and the second half sense amplifier output signal corresponding to the second bit line.

15. The memory circuit of claim 14, wherein a ratio between the first gain of the first half sense amplifier and the second gain of the second half sense amplifier is adjusted to be a predetermined number which is a rational number greater than zero.

16. The memory circuit of claim 15, wherein the ratio between the first gain of the first half sense amplifier and the second gain of the second half sense amplifier is adjusted to be a one to one.

17. The memory circuit of claim 11, wherein the locking code register circuit comprises a plurality of registers as each of the plurality of registers correspond to a binary digit of the digital locking sequence and further receives a clock signal to operate the plurality of registers.

18. The memory circuit of claim 17, wherein the locking transistor circuit comprises
   a plurality of current mirrors, each of the plurality of current mirrors is respectively connected to each of the plurality of registers as each of the plurality of registers turns on or off a different one of the plurality of current mirrors.

19. The memory circuit of claim 18, wherein each of the plurality of current mirrors comprises a P-type transistor, and the first gain of the first half sense amplifier is determined based on the width to length (W/L) ratio of the composite P-type transistors of the plurality of current mirrors.

20. The memory circuit of claim 19, wherein the first half sense amplifier circuit comprises a current source circuit with a first terminal connected to the memory cell clamp circuit, a second terminal connected to the second half sense amplifier circuit and a switch which is connected to the first terminal and the second terminal, and a third terminal connected to a power supply voltage.

* * * * *